(12) United States Patent
Lowrey et al.

(10) Patent No.: US 6,511,867 B2
(45) Date of Patent: Jan. 28, 2003

(54) UTILIZING ATOMIC LAYER DEPOSITION FOR PROGRAMMABLE DEVICE

(75) Inventors: Tyler A. Lowrey, San Jose, CA (US); Charles H. Dennison, San Jose, CA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 09/896,529

(22) Filed: Jun. 30, 2001

(65) Prior Publication Data

US 2003/0003634 A1 Jan. 2, 2003

(51) Int. Cl.$^7$ ...................... H01L 21/82; H01L 21/4763
(52) U.S. Cl. ........................ 438/128; 438/643; 438/648
(58) Field of Search ............................. 438/128, 131, 438/132, 653, 643, 648, 656

(56) References Cited

U.S. PATENT DOCUMENTS

| | | | |
|---|---|---|---|
| 5,296,716 A | | 3/1994 | Ovshinsky et al. ............. 257/3 |
| 5,780,323 A | * | 7/1998 | Forouhi et al. ............. 438/131 |
| 5,789,758 A | | 8/1998 | Reinberg ....................... 257/3 |
| 5,879,459 A | * | 3/1999 | Gadgil et al. ................ 118/715 |
| 5,879,955 A | | 3/1999 | Gonzalez et al. ........... 438/128 |
| 5,920,788 A | | 7/1999 | Reinberg .................... 438/466 |
| 5,933,365 A | | 8/1999 | Klersy et al. ................ 365/148 |
| 5,970,336 A | | 10/1999 | Wolstenhome et al. ..... 438/238 |
| 5,998,244 A | | 12/1999 | Wolstenholme et al. ........ 257/3 |
| 6,002,140 A | | 12/1999 | Gonzalez et al. .............. 257/3 |
| 6,031,287 A | | 2/2000 | Harshfield ................... 257/734 |
| 6,087,674 A | | 7/2000 | Ovshinsky et al. ............. 257/2 |
| 6,150,199 A | * | 11/2000 | Whitten et al. .............. 438/128 |
| 6,153,890 A | | 11/2000 | Wolstenholme et al. ........ 257/3 |
| 6,159,836 A | * | 12/2000 | Wei ............................ 438/600 |
| 6,229,157 B1 | | 5/2001 | Sandhu ......................... 257/75 |

* cited by examiner

Primary Examiner—T. N. Quach
(74) Attorney, Agent, or Firm—Trop, Pruner & Hu, P.C.

(57) ABSTRACT

In an aspect, an apparatus is provided that sets and reprograms the state of programmable devices. In an aspect, a method is provided such that an opening is formed through a dielectric exposing a contact, the contact formed on a substrate. An electrode is conformally deposited on a wall of the dielectric, utilizing atomic layer deposition (ALD). A programmable material is formed on the electrode and a conductor is formed to the programmable material. In an aspect, a barrier is conformally deposited utilizing ALD, between the electrode and the programmable material.

5 Claims, 14 Drawing Sheets

UTILIZING ATOMIC LAYER DEPOSITION FOR PROGRAMMABLE DEVICE

FIELD

Programmable devices, including phase change memory devices that can be programmed by modifying the state of a phase change material.

BACKGROUND

Typical computers, or computer related devices, include physical memory, usually referred to as main memory or random access memory (RAM). Generally, RAM is memory that is available to computer programs and read-only memory (ROM) is memory that is used, for example, to store programs that boot a computer and perform diagnostics. Typical memory applications include dynamic random access memory (DRAM), static random access memory (SRAM), erasable programmable read-only memory (EPROM), and electrically erasable programmable read-only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPRROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices as the memory storage element, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reprogrammed as that value represents a physical state of the material (e.g., crystalline or amorphous). Thus, phase change memory materials represent a significant improvement in non-volatile memory.

One characteristic common to solid state and phase change memory devices is significant power consumption particularly in setting or reprogramming memory elements. Power consumption is significant, particularly in portable devices that rely on power cells (e.g., batteries). It would be desirable to decrease the power consumption of a memory device.

Another characteristic common to solid state and phase change memory devices is limited reprogrammable cycle life from/to an amorphous and crystalline state. Further, over time the phase change material can fail to reliably reprogram from/to an amorphous and a crystalline state. It would be desirable to increase the programmable cycle life of the phase change memory material.

BRIEF DESCRIPTION OF THE DRAWINGS

Advantages of the invention will become apparent upon reading the following detailed description and upon reference to the drawings, in which.

DETAILED DESCRIPTION

Exemplary embodiments are described with reference to specific configurations. Those of ordinary skill in the art will appreciate that various changes and modifications can be made while remaining within the scope of the appended claims. Additionally, well-known elements, devices, components, circuits, process steps and the like are not set forth in detail in order to avoid obscuring the present invention.

A memory device utilizing programmable material to determine the state of memory elements of the device is described that reprograms to an amorphous and crystalline state. The described memory device and method provides improved device reliability, improved programmable cycle life and decreased power consumption relative to previous devices. Further, in an embodiment, the apparatus is manufacturable utilizing conventional process toolsets and facilities.

In an embodiment, atomic layer deposition (ALD) provides electrode device construction advantages, including reduction of required programming current for a reset, set and read operation in the memory device. By utilizing ALD or atomic layer chemical vapor deposition (ALCVD) in place of chemical vapor deposition (CVD) techniques, electrode device construction advantages are provided, including the ability to deposit very thin and conformal films. The film thickness is controlled by the number of applied deposition steps with a resolution defined by the thickness of one monolayer. Further, ALD deposition provides large area film uniformity and accuracy.

Figure 1:
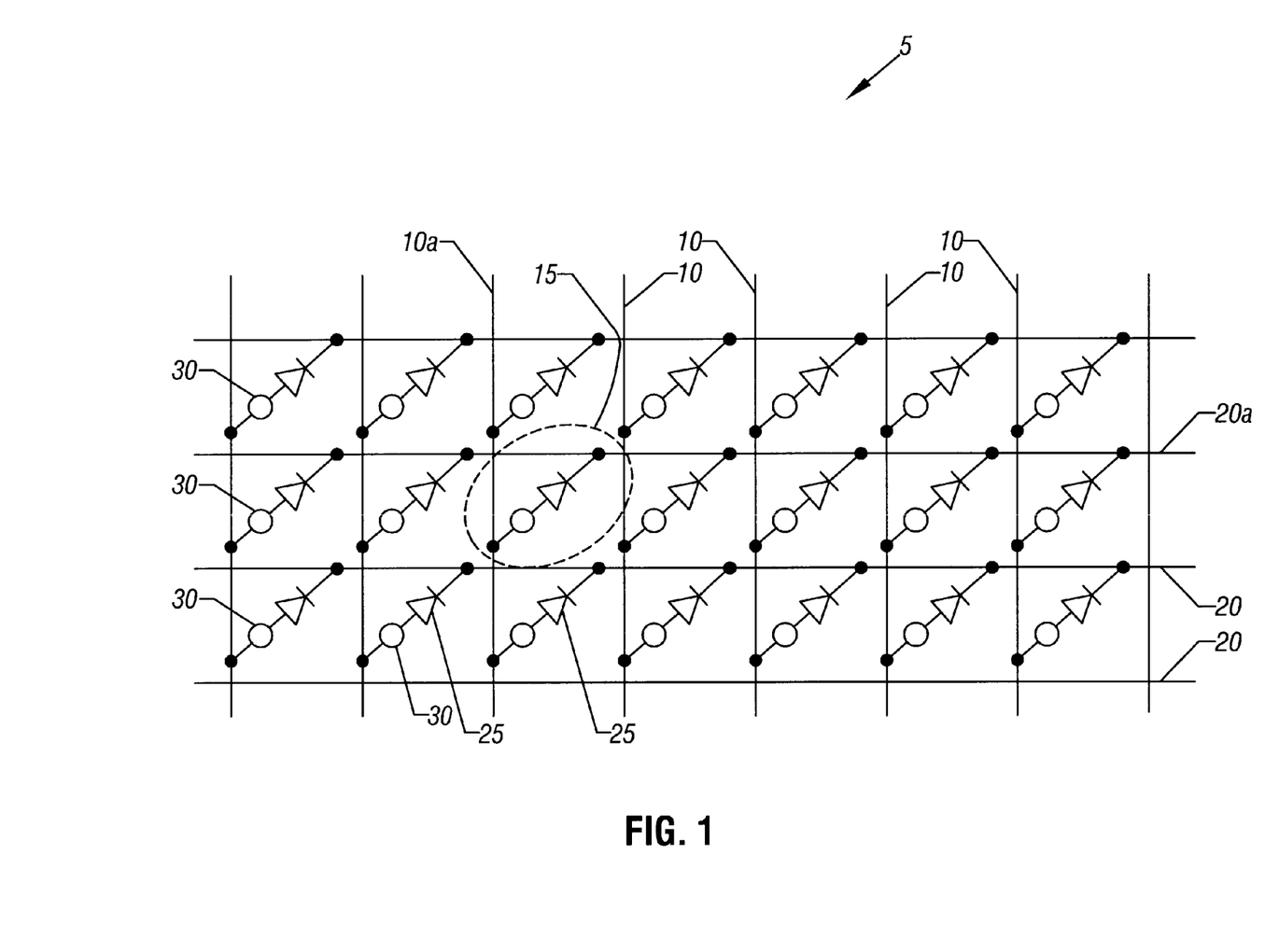
FIG. 1 is a schematic diagram of an embodiment of an array of memory elements.

FIG. 1 shows a schematic diagram of an embodiment of a memory array comprised of a plurality of memory elements presented and formed in the context of the description provided herein. In this example, the circuit of memory array 5 includes an xy grid with memory elements 30 electrically interconnected in series with isolation devices 25 on a portion of a chip. Address lines 10 (e.g., columns) and 20 (e.g., rows) are connected, in one embodiment, to external addressing circuitry in a conventional manner. One purpose of the xy grid array of memory elements in combination with isolation devices is to enable each discrete memory element to be read and written without interfering with the information stored in adjacent or remote memory elements of the array.

A memory array such as memory device 5 of FIG. 1 can be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 can be fabricated over an area of the substrate at the wafer level and then the wafer reduced through singulation into discrete die or chips, some or all of the die or chips having a memory array formed thereon. Additional addressing circuitry (e.g., decoders, etc.) can be formed as known to those of skill in the art.

Figure 2:
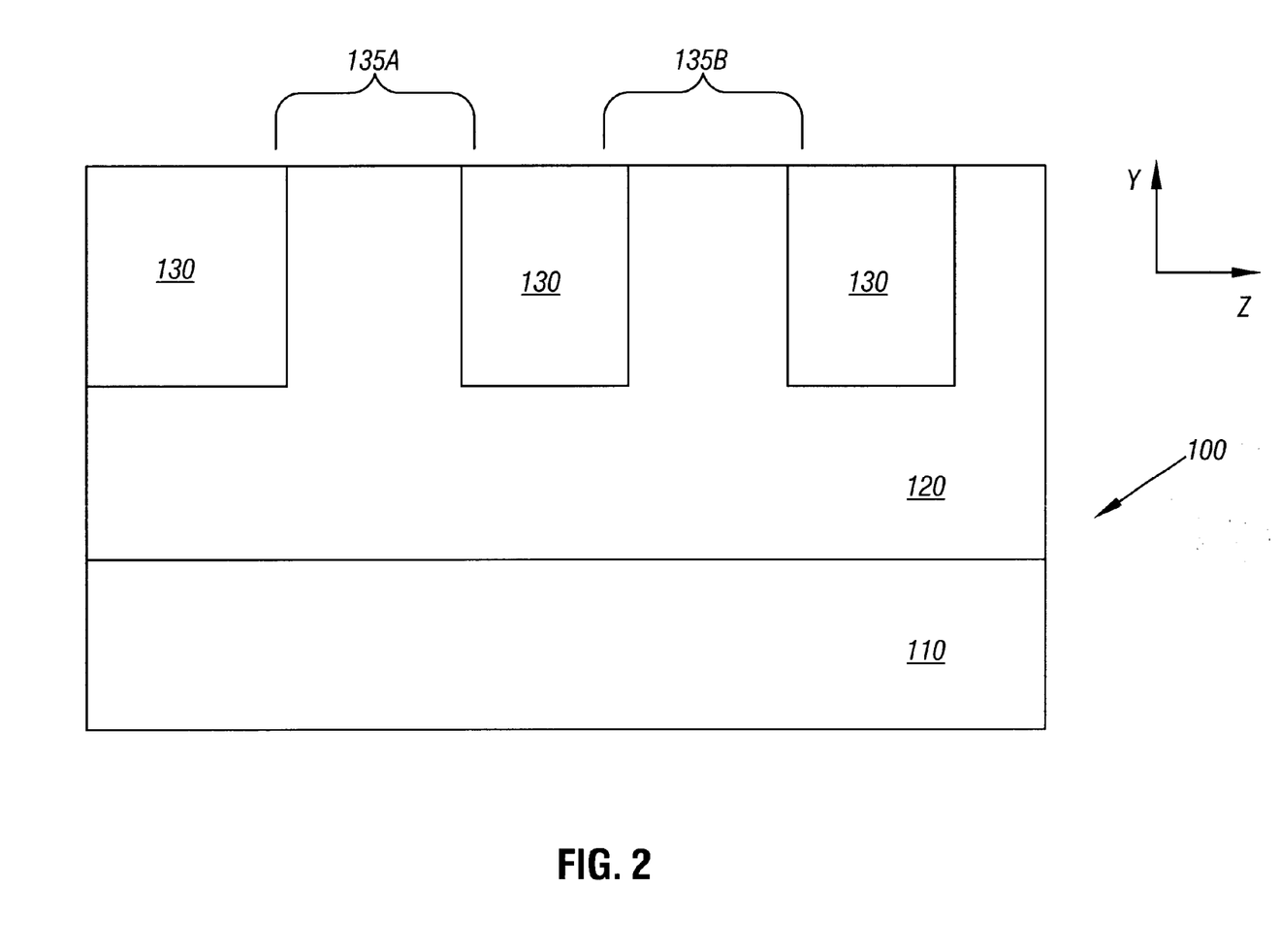
FIG. 2 schematically illustrates a cross-sectional planar side view of a portion of a semiconductor substrate having dielectric trenches formed therein defining a z-direction thickness of a memory cell in accordance with one embodiment of forming a memory element on a substrate.

FIGS. 2–14 illustrate an embodiment of the fabrication of representative memory element 15 of FIG. 1. FIG. 2 depicts a portion of substrate 100 that is, for example, a semiconductor (e.g., silicon) substrate. In this example, a P-type dopant such as boron is introduced in portion 110. In one example, a suitable concentration of P-type dopant is on the order of about $5 \times 10^{19}$ to $1 \times 10^{20}$ atoms per cubic centimeter (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16}$ to $10^{17}$ atoms/cm$^3$.

FIG. 2 also depicts shallow trench isolation (STI) structures 130 formed in epitaxial portion 120 of substrate 100.

As will become apparent in the subsequent discussion, STI structures 130 serve, in one aspect, to define the z-direction thickness of a memory cell, with at this point only the z-direction thickness of a memory cell defined. In one embodiment, memory cell z-direction regions 135A and 135B are patterned as strips with the x-direction dimension greater than the z-direction dimension. In another aspect, STI structures 130 serve to isolate individual memory elements from one another as well as associated circuit elements (e.g., transistor devices) formed in and on the substrate. Current state of the art photolithography techniques utilized to pattern STI structures define the z-direction thickness of memory cell regions 135A and 135B can produce feature sizes (z-direction thickness) as small as 0.18 microns ($\mu$m).

Figure 3:
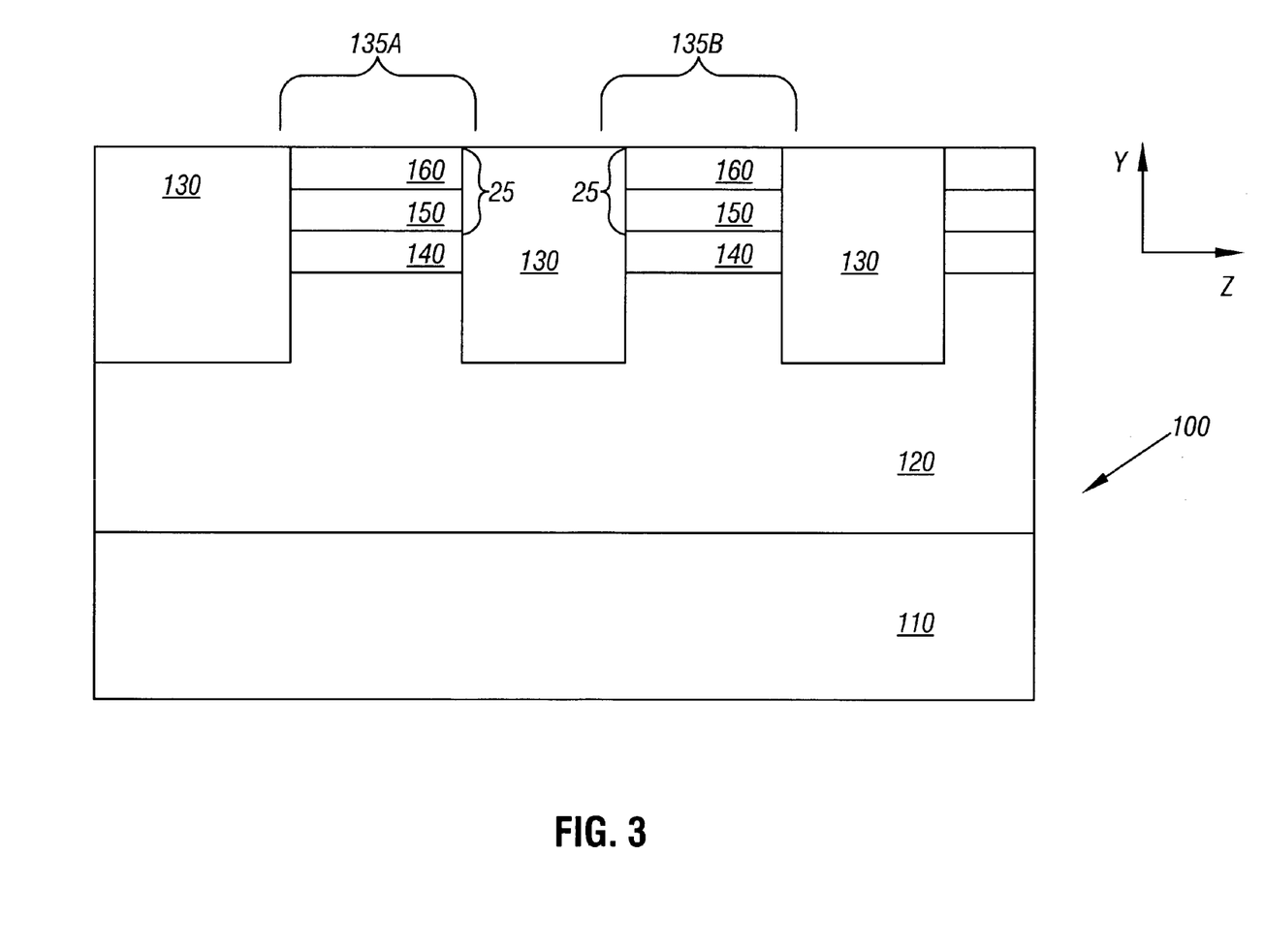
FIG. 3 depicts the structure of FIG. 2, through the same cross-sectional view, after the introduction of dopants to form an isolation device for a memory element.

FIG. 3 depicts the structure of FIG. 2 after further fabrication operations in memory cell regions 135A and 135B. Within each memory cell region (strip), overlying epitaxial portion 120 of substrate 100 is signal line material 140. In one example, signal line material 140 is N-type doped polysilicon formed by the introduction of, for example, phosphorous or arsenic to a concentration on the order of about $10^{18}$ to $10^{19}$ atoms/cm$^3$ (e.g., N$^+$silicon). In this example, signal line material 140 serves as an address line, a row line (e.g., row line 20 of FIG. 1). Overlying signal line material 140 is an isolation device (e.g., isolation device 25 of FIG. 1). In one example, the isolation device is a PN diode formed of N-type silicon portion 150 (e.g., dopant concentration on the order of about $10^{14}$ to $10^{18}$ atoms/cm$^3$) and P-type silicon portion 160 (e.g., dopant concentration on the order of about $10^{19}$ to $10^{20}$ atoms/cm$^3$). Although a PN diode is shown, it is to be appreciated that other isolation structures are similarly suitable. Such devices include, but are not limited to, metal oxide semiconductor (MOS) devices.

Figure 4:
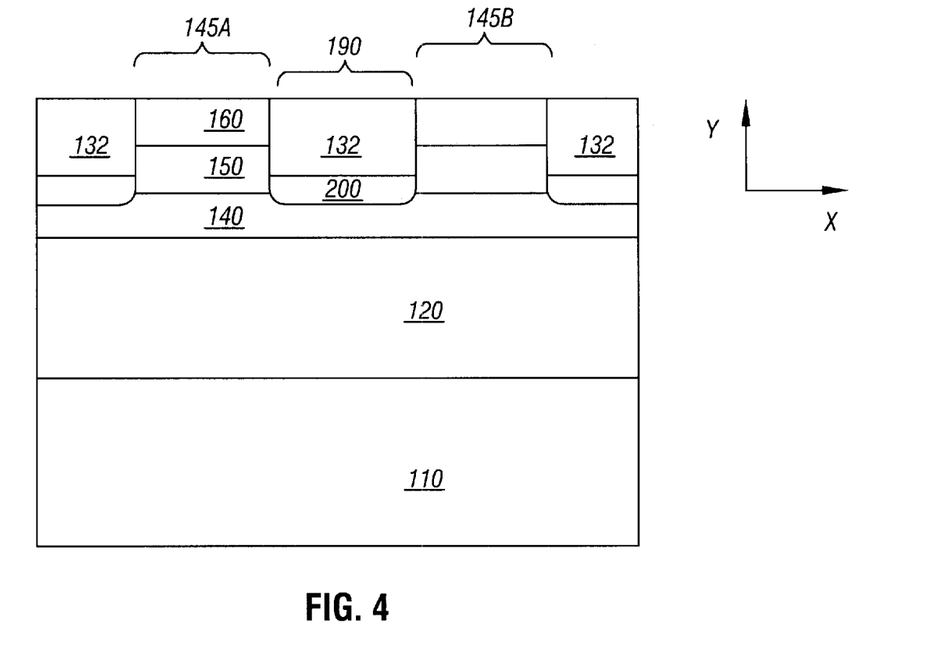
FIG. 4 depicts the structure of FIG. 3 forming trenches.

FIG. 4 depicts the structure of FIG. 3 from an xy perspective after forming trenches 190 in epitaxial portion 120 of substrate 100. Trenches 190 are formed, in this example, orthogonal to STI structures 130. Trenches 190 define the x-direction thickness of a memory cell. According to current photolithographic techniques, a suitable feature size for the x-direction thickness is as small as 0.25 $\mu$m. FIG. 4 also depicts memory cells 145A and 145B separated by trenches 190, having a z-direction thickness defined by STI structures 130 and an x-direction thickness defined by trenches 190. The definition of the x-direction thickness involves, in one embodiment, an etch to the conductor or signal line 140 of the memory line stack to define memory cells 145A and 145B of memory cell region 135A. In the case of an etch, the etch proceeds through the memory line stack to, in this example, a portion of conductor or signal line 140. A timed etch can be utilized to stop an etch at this point. Following the patterning, N-type dopant is introduced at the base of each trench 190 to form pockets 200 having a dopant concentration on the order of about $10^{18}$ to $10^{20}$ atoms/cm$^3$ (e.g., N$^+$region) between memory cells 145A and 145B.

Figure 5:
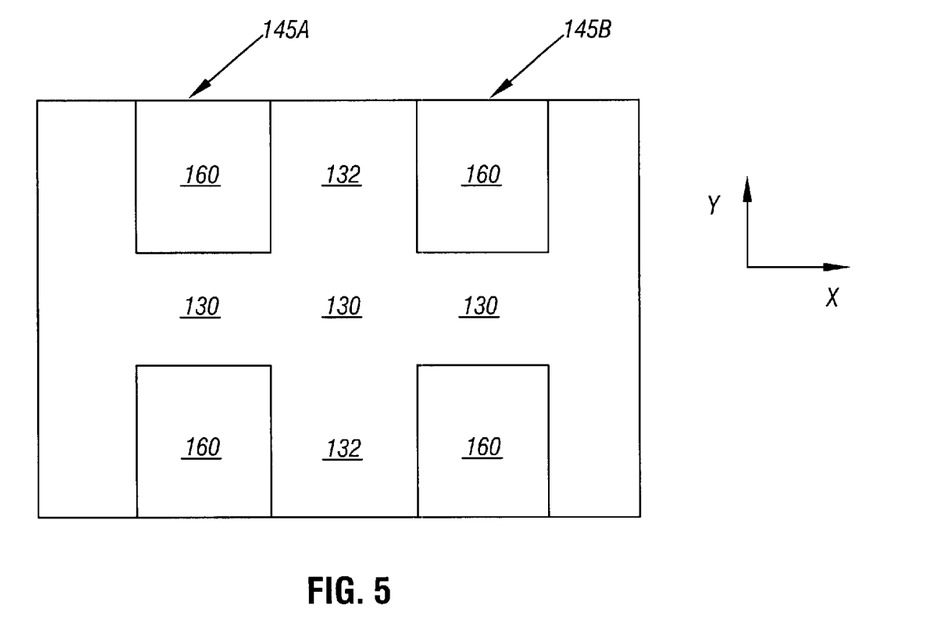
FIG. 5 depicts a schematic top view of the structure of FIG. 4.

Following the introduction of pockets 200, a dielectric material such as silicon dioxide is introduced in trenches 190 to form STI structures 132. The superior surface (as viewed) may then be planarized with, for example, a chemical-mechanical polish. FIG. 5 depicts an xz perspective of the structure of FIG. 4 with memory cells (e.g., memory cells 145A and 145B) separated by STI structures 130 and 132.

Figure 6:
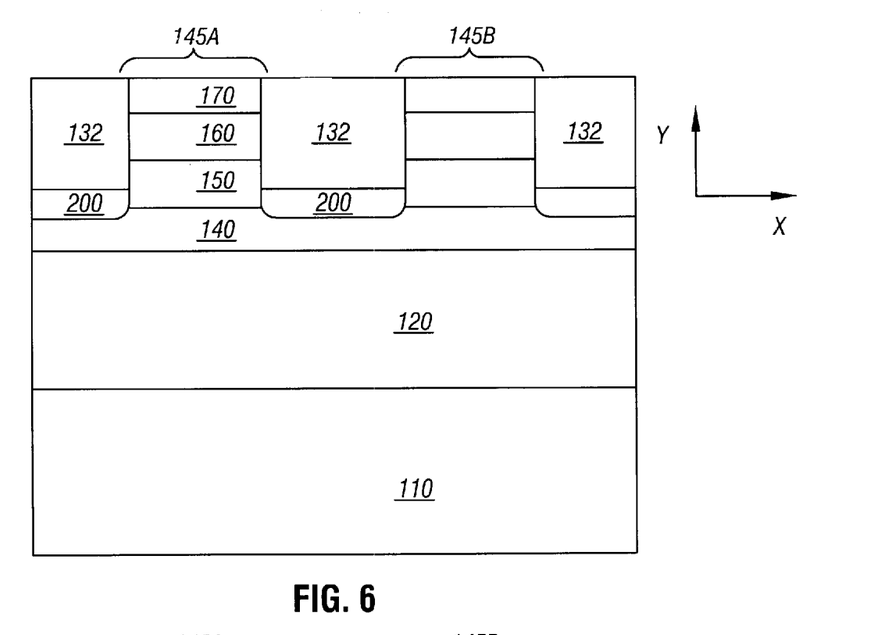
FIG. 6 depicts a cross-section of the structure of FIG. 4 after forming contacts.

FIG. 6 depicts the structure of FIG. 4 (i.e., an xy perspective) following the formation of a material of, in this example, refractory metal suicide such as cobalt silicide (CoSi$_2$) in a portion of p-type silicon portion 160 to define contact 170. Contact 170, in one aspect, serves as a low resistance material in the fabrication of peripheral circuitry (e.g., addressing circuitry) of the circuit structure o n the chip.

Figure 7:
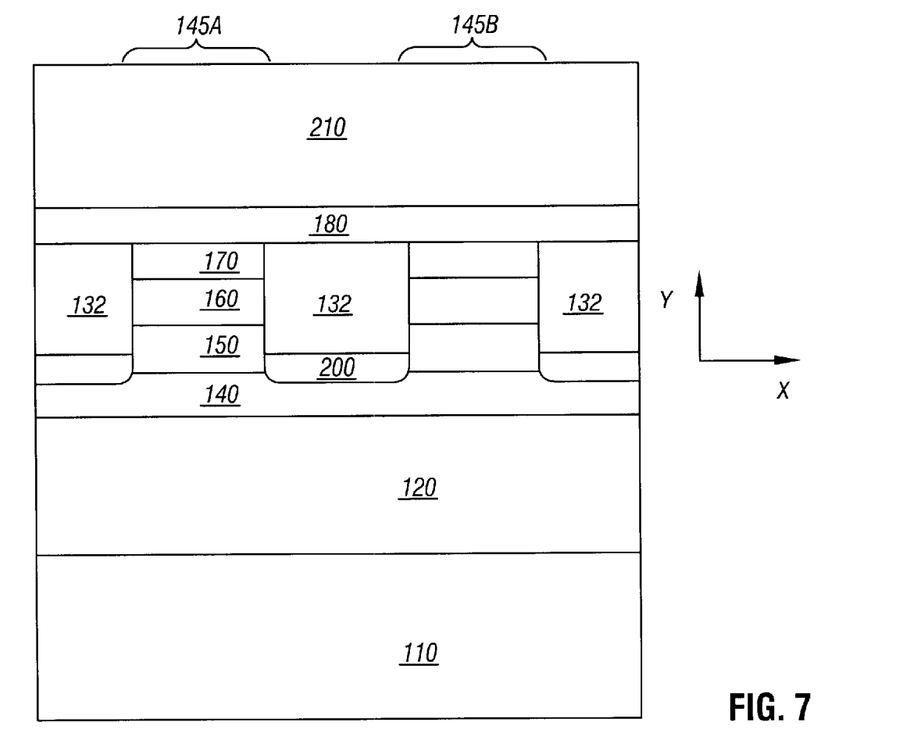
FIG. 7 depicts the structure of FIG. 6, through the same cross-sectional view, after forming a masking material and a dielectric material.

FIG. 7 depicts the structure of FIG. 6 after the introduction of masking material 180. As will become more clear later, masking material 180 serves, in one sense, as an etch stop for a subsequent etch operation. In one embodiment, a suitable material for masking material 180 is a dielectric material such as silicon nitride ($Si_3N_4$).

FIG. 7 also depicts dielectric material 210 introduced over the structure to a thickness on the order of 100 Å to 50,000 Å sufficient to blanket memory cells 145A and 145B. In one embodiment, dielectric material 210 is $SiO_2$. In another embodiment, dielectric material 210 is a material selected for its reduced thermal conductivity, κ, preferably a thermal conductivity less than $κ_{SiO_2}$, more preferably three to 10 times less $κ_{SiO_2}$. As a general convention, $SiO_2$ and $Si_3N_4$ have κ values on the order of 1.0. Thus, in addition to $SiO_2$, suitable materials for dielectric material 210 include those materials that have κ values less than 1.0. Certain high temperature polymers having κ values less than 1.0, include carbide materials, Aerogel, Xerogel (κ on the order of 0.1) and their derivatives.

Figure 8:
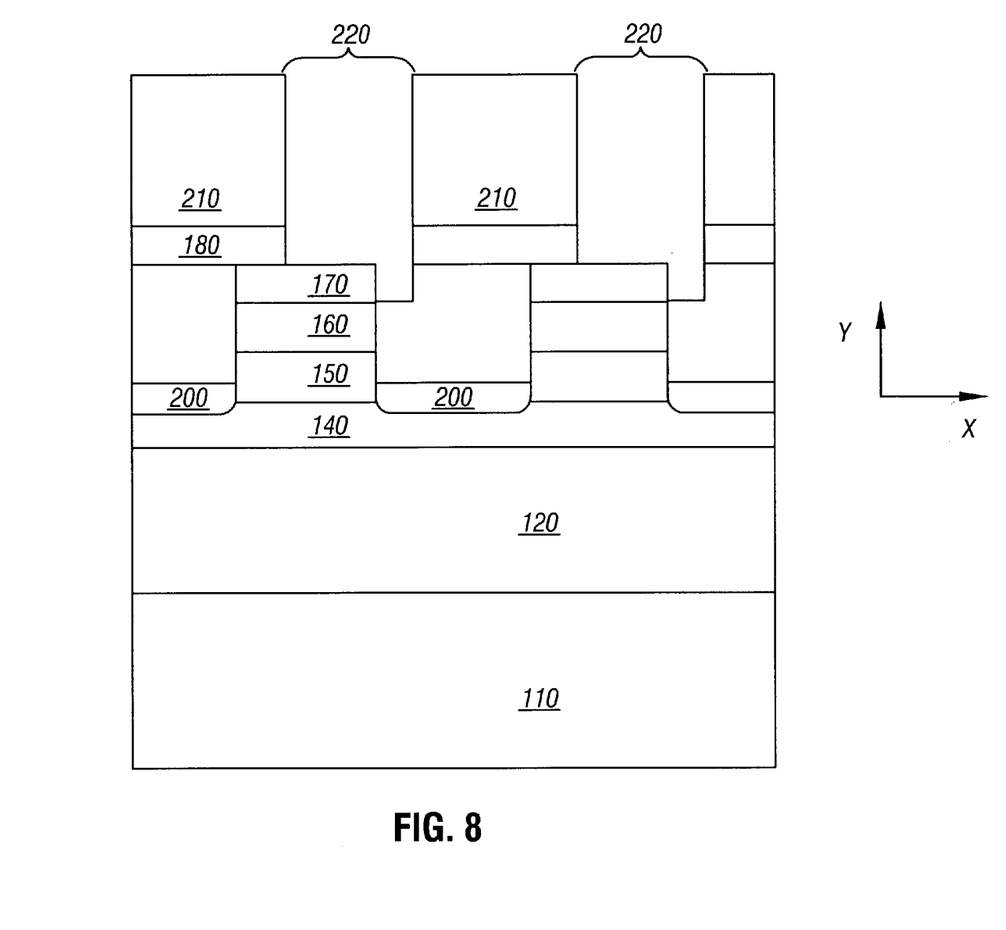
FIG. 8 depicts the structure of FIG. 7, through the same cross-sectional view, after the formation of an opening through the dielectric exposing the contact.

FIG. 8 depicts the structure of FIG. 7, through the same cross-sectional view, after forming openings 220 through dielectric 210 and masking material 180, exposing contact 170. The formation of openings 220 may be accomplished using etch patterning with an etchant(s) selective for etching dielectric material 210 and masking material 180 but not contact 170 (e.g., contact 170 serves as an etch stop).

Figure 9:
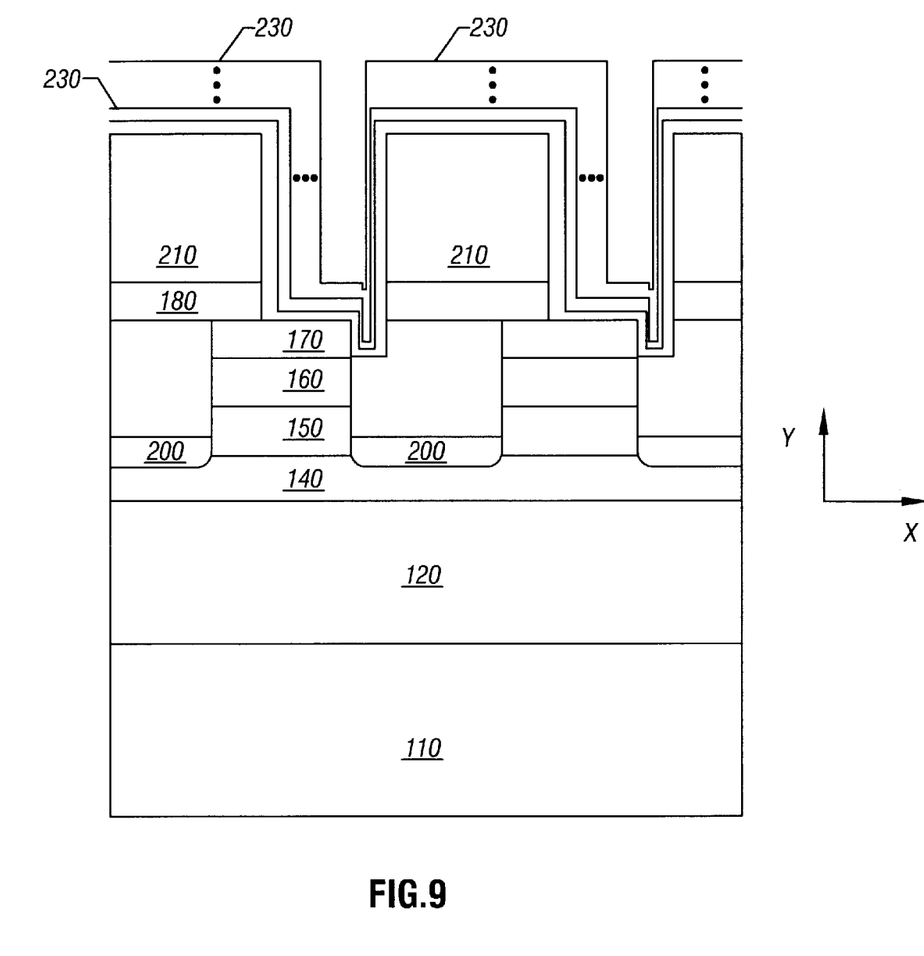
FIG. 9 depicts the structure of FIG. 8, through the same cross-sectional view, showing the creation of electrode monolayers on the dielectric and on the contact, utilizing ALD.

FIG. 9 depicts the structure of FIG. 8, through the same cross-sectional view, depicting the conformal formation of electrode material 230, utilizing ALD. Utilizing ALD, one reactant gas is introduced at a time. The first gas is "chemisorped" onto the surface of dielectric 210, masking material 180 and contact 170 forming chemisorbed layer 230A. Excess gas is then purged and the second gas introduced. This gas reacts with the chemisorped layer 230A, creating a monolayer of deposited film 230B. Individual precursors are pulsed onto surfaces in a sequential manner, without mixing precursors in the gas phase. Each individual precursor reacts with a surface to form an atomic layer in such a way that one layer forms at a time. The ALD process is self-limiting. That is, the surface reaction occurs and completes such that not more than one layer is deposited at a time, regardless of the number of molecules applied to the surface in an overdosing mode. Films are built up by introducing short bursts of gases in cycles. Conventional CVD processes typically operate above 500° C. while ALD is possible below 400° C., making it compatible with an industry trend to lower temperatures.

The thin sidewall films define the x-axis dimension of the electrode (as will become more apparent in FIG. 11), the x-axis dimension being an important dimension in terms of device performance. The x-axis dimension determines the required programming current for a reset, set, and read operation. The smaller the x-axis dimension that can be repeatedly reproduced, the smaller the required programming currents needed to operate the device. This is due to the smaller volume of programmable material whose phase is being changed and due to the reduced heat loss.

In an embodiment, electrode material 230 (collectively 230A, 230B, . . . , 230N atomic layers) has uniform film thickness, ultra-thin thickness (with respect to the x-axis dimension depicted in FIG. 11) and is a conformal film. In an embodiment, electrode material 230 has an x-axis dimension on the order of 10 angstroms to 1000 angstroms. In an embodiment, electrode material 230 is at least one of tungsten (W), tungsten nitride (WN), titanium nitride (TiN), titanium silicon nitride (TiSiN), and tantalum nitride (TaN). In an embodiment, electrode material 230 has a resistivity on the order of 0.001 to 0.05 ohm-cm resistivity.

Figure 10:
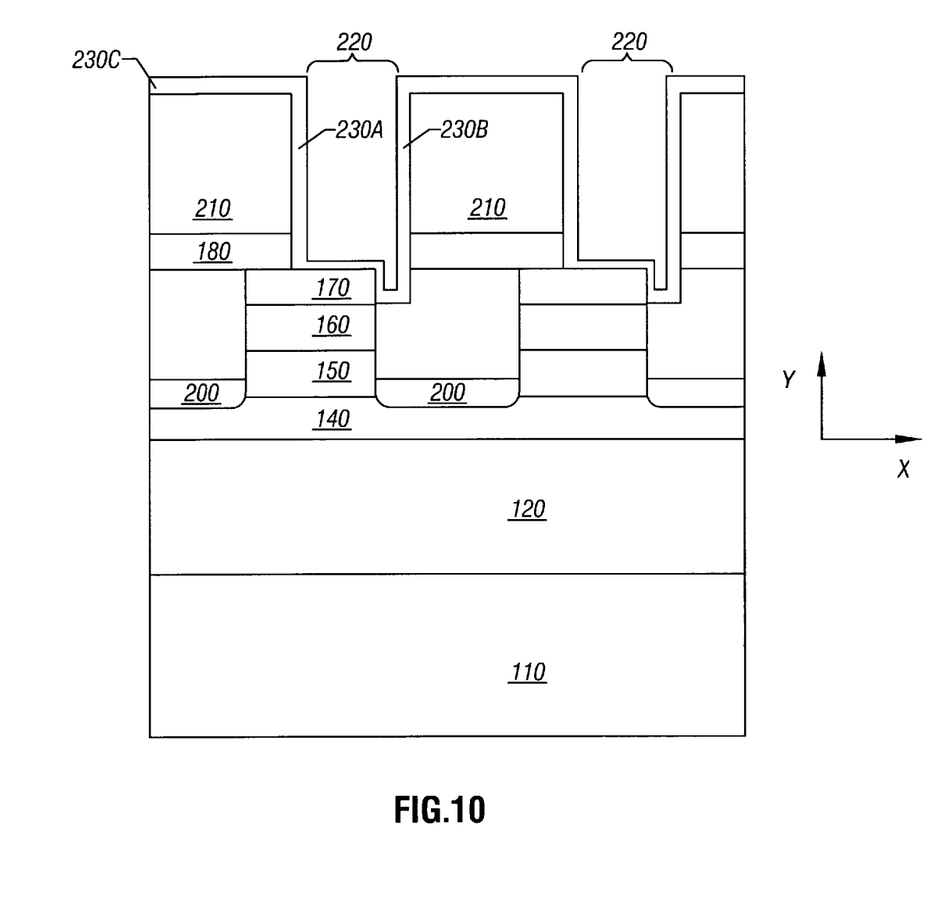
FIG. 10 depicts the structure of FIG. 9, through the same cross-sectional view, after conformally forming the electrode on the dielectric and on the contact.

FIG. 10 depicts the structure of FIG. 9 after the completion of conformal formation of electrode material 230. The introduction is conformal in the sense that electrode material 230 is formed along the side walls and base of openings 220 (showing electrode material portions 230A, 230B and 230C) such that electrode material 230 is in contact with contact 170. The isolation of a single conductive path (such as electrode material 230A) may be accomplished through an angled introduction of a dopant (i.e., angled away from electrode material 230B).

Figure 11:
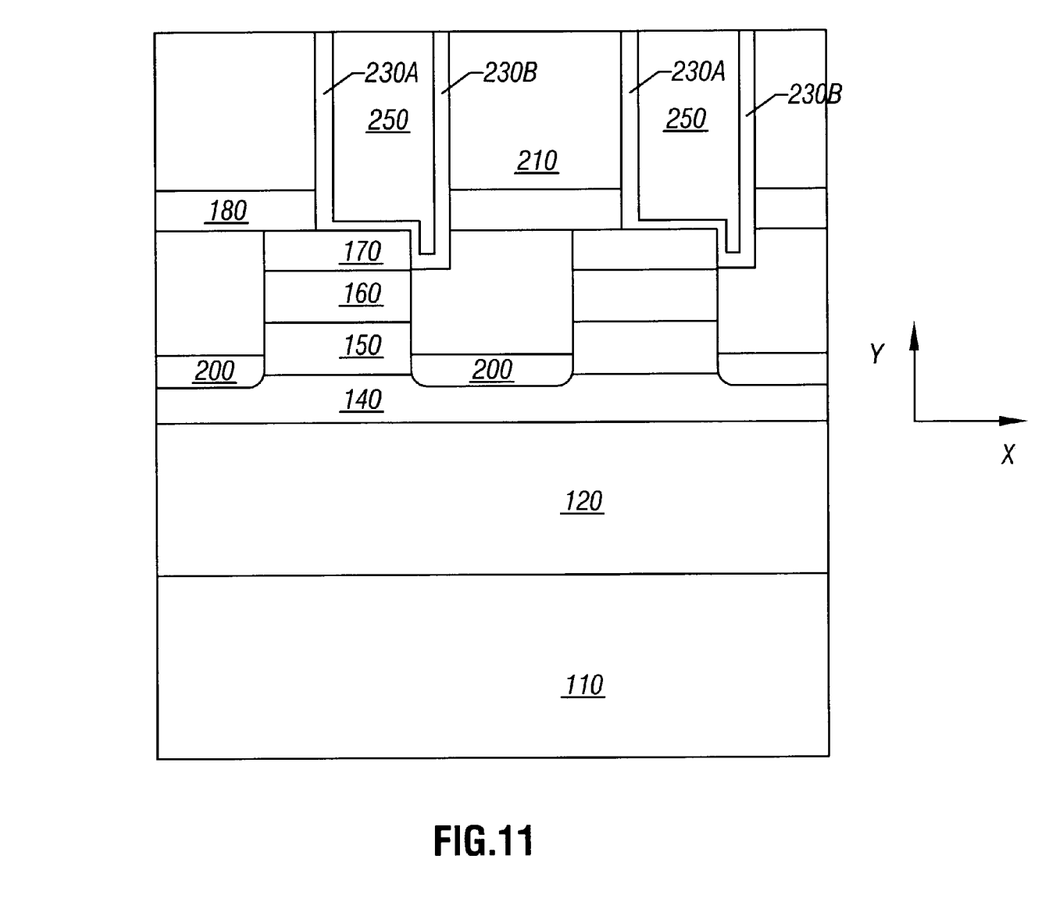
FIG. 11 depicts the structure of FIG. 10, through the same cross-sectional view, after forming a dielectric in the opening and removing a horizontal portion of the electrode.

FIG. 11 shows the structure after the introduction of dielectric material 250 into openings 220. In one embodiment, dielectric material 250 is silicon dioxide ($SiO_2$). In another embodiment, dielectric material 250 is a material that has a thermal conductivity, κ, that is less than the thermal conductivity of $SiO_2$, $κ_{SiO_2}$ preferably three to 10 times less than $κ_{SiO_2}$. Following introduction, the structure is subjected to a planarization that removes the horizontal component of electrode material 230. Suitable planarization techniques include those known to those of skill in the art, such as chemical or chemical-mechanical polish (CMP) techniques.

Figure 12:
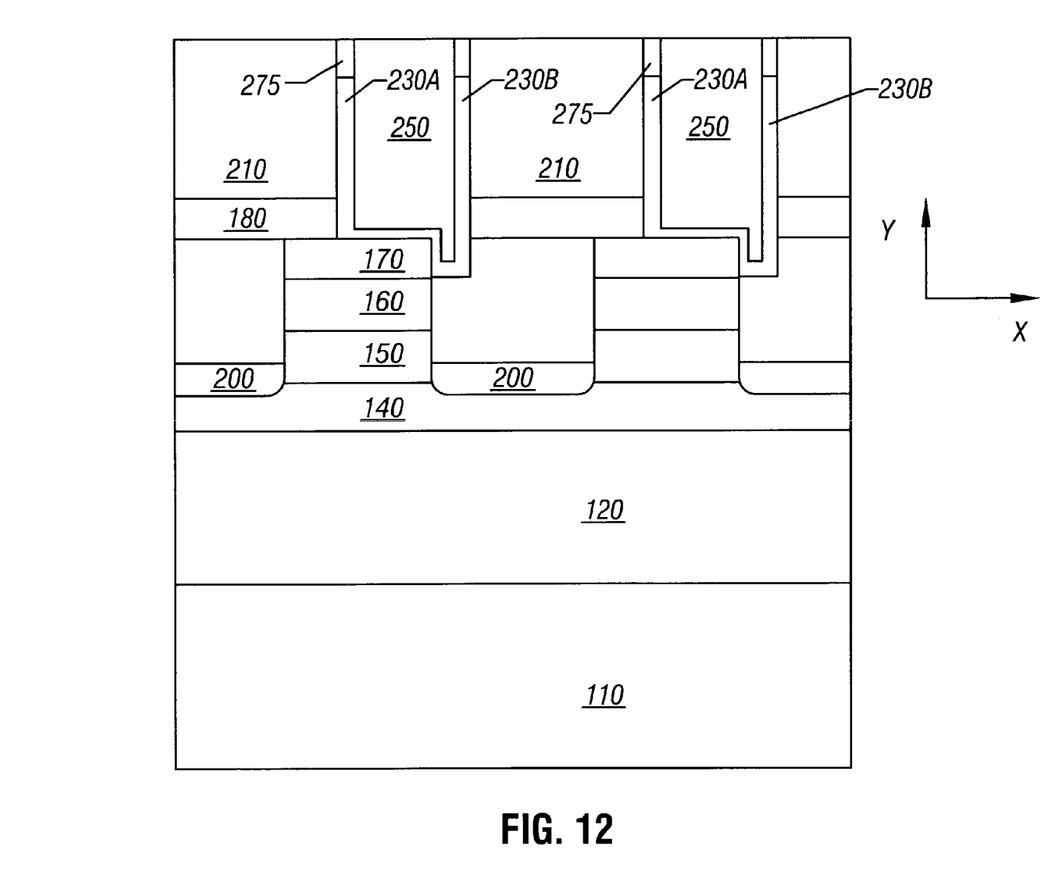
FIG. 12 depicts the structure of FIG. 11, through the same cross-sectional view, after conformally forming a barrier on the electrode, utilizing ALD.

FIG. 12 depicts the structure of FIG. 11, through the same cross-sectional view, after the optional conformal formation of barrier 275 utilizing ALD. In an embodiment, electrode 230 is selectively etched, ALD of barrier 275 is utilized to fill the area etched, and barrier 275 is then planarized.

Figure 13:
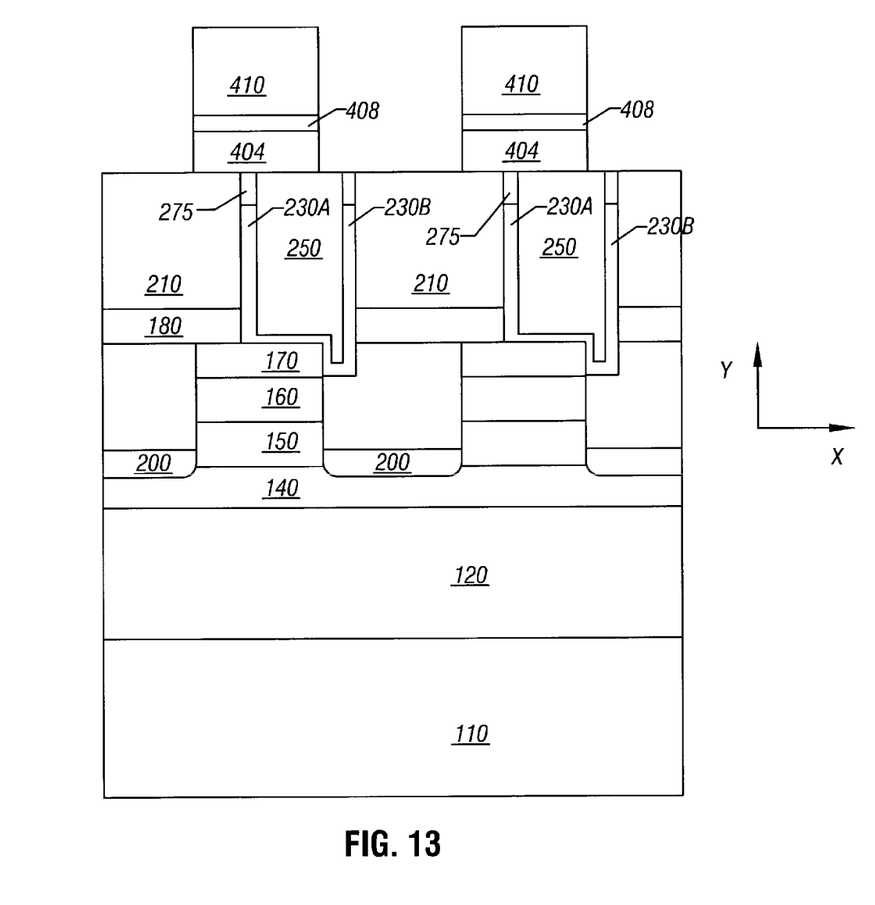
FIG. 13 depicts the structure of FIG. 12, through the same cross-sectional view, after forming and patterning a programmable material, a barrier and a conductor.

FIG. 13 depicts the structure of FIG. 12, through the same cross-sectional view, after the formation and patterning of conductor 410, barrier 408, and programmable material 404. The patterning can be accomplished using conventional photolithographic and etch techniques. In this example, the etching proceeds through a portion of programmable material 404, barrier 408 and conductor 410, to the exclusion of barrier 275, dielectric 210 and dielectric 250. In one embodiment, programmable material 404 is a phase change material that has a property such that its physical state (e.g., crystalline, amorphous) can be modified with the application of an amount of energy (e.g., electrical energy, thermal energy). Chalcogenide materials having the general formula are known to be suitable for this purpose. In an embodiment, chalcogenide alloys suitable as programmable material 404 include at least one element from column VI of the Periodic Table Of The Elements. In an embodiment, $Ge_2Sb_2Te_5$ is utilized as programmable material 404. Other chalcogenide alloys utilized as programmable material 404 include GaSb, InSb, InSe, $Sb_2Te_3$, GeTe, InSbTe, GaSeTe, $SnSb_2Te_4$, InSbGe, AgInSbTe, (GeSn)SbTe, GeSb(SeTe), and $Te_{81}Ge_{15}Sb_2S_2$.

Barrier 408 includes one of, for example, titanium (Ti) and titanium nitride (TiN). Barrier 408 serves, in one aspect, to inhibit diffusion between the volume of programmable material 404 and second signal line material overlying the volume of programmable material 404 (e.g., second electrode 10). Overlying barrier 408 is signal line material 410. In this example, signal line material 410 serves as an address line, a column line (e.g., column line 10 of FIG. 1). Signal line material 410 is patterned to be, in one embodiment, generally orthogonal to signal line material 140 (column lines are orthogonal to row lines). Signal line material 410 is, for example, an aluminum material, such as an aluminum alloy. Methods for the introduction and patterning of barrier 408 and signal line material 410 include techniques known to those skilled in the art.

Figure 14:
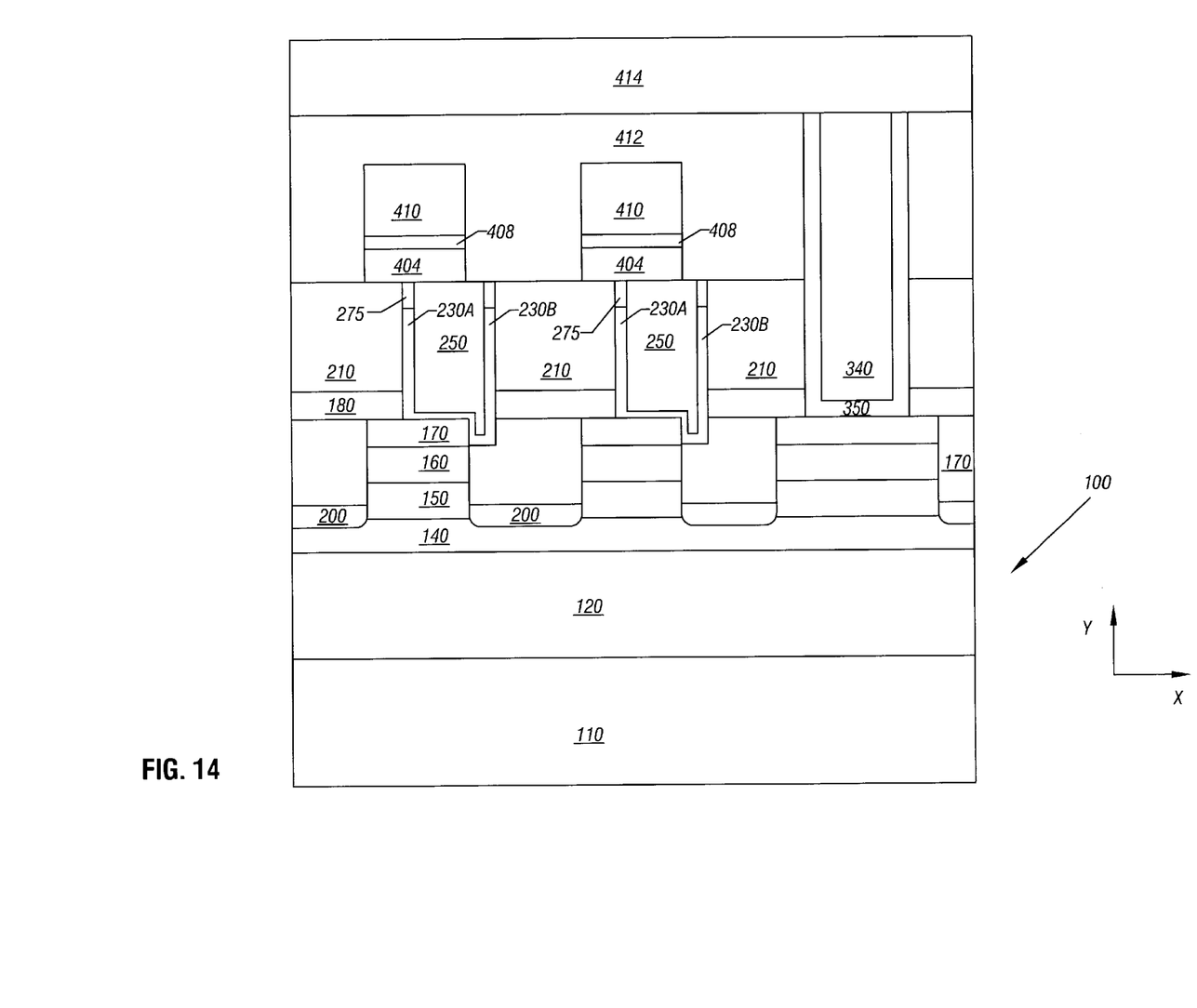
FIG. 14 depicts the structure of FIG. 13, through the same cross-sectional view, after forming a dielectric on the conductor, forming a via, and forming a signal line on the dielectric.

FIG. 14 shows the structure of FIG. 13 after forming dielectric material 412 on conductor 410. Dielectric material 412 is, for example, $SiO_2$ or other suitable material that is formed on conductor 410 to electronically isolate conductor 410. Following the formation, dielectric material 412 is planarized and a via is formed in a portion of the structure through dielectric material 412, dielectric material 210, and dielectric material 180 to contact 170. The via is filled with conductive material 340 such as tungsten (W) and barrier material 350 such as a combination of titanium (Ti) and titanium nitride (TiN). Techniques for introducing dielectric material 412, forming and filling conductive vias, and planarizing are known to those skilled in the art. The structure shown in FIG. 14 also shows additional signal line material 414 formed and patterned to mirror that of signal line material 140 (e.g., row line) formed on substrate 100. Mirror conductor line material 414 mirrors signal line material 140 and is coupled to signal line material 140 through the conductive via. By mirroring a doped semiconductor such as N-type silicon, mirror conductor line material 414 serves, in one aspect, to reduce the resistance of signal line material 140 in a memory array, such as memory array 5 illustrated in FIG. 1. A suitable material for mirror conductor line material 414 includes an aluminum material, such as an aluminum alloy.

Figure 15:
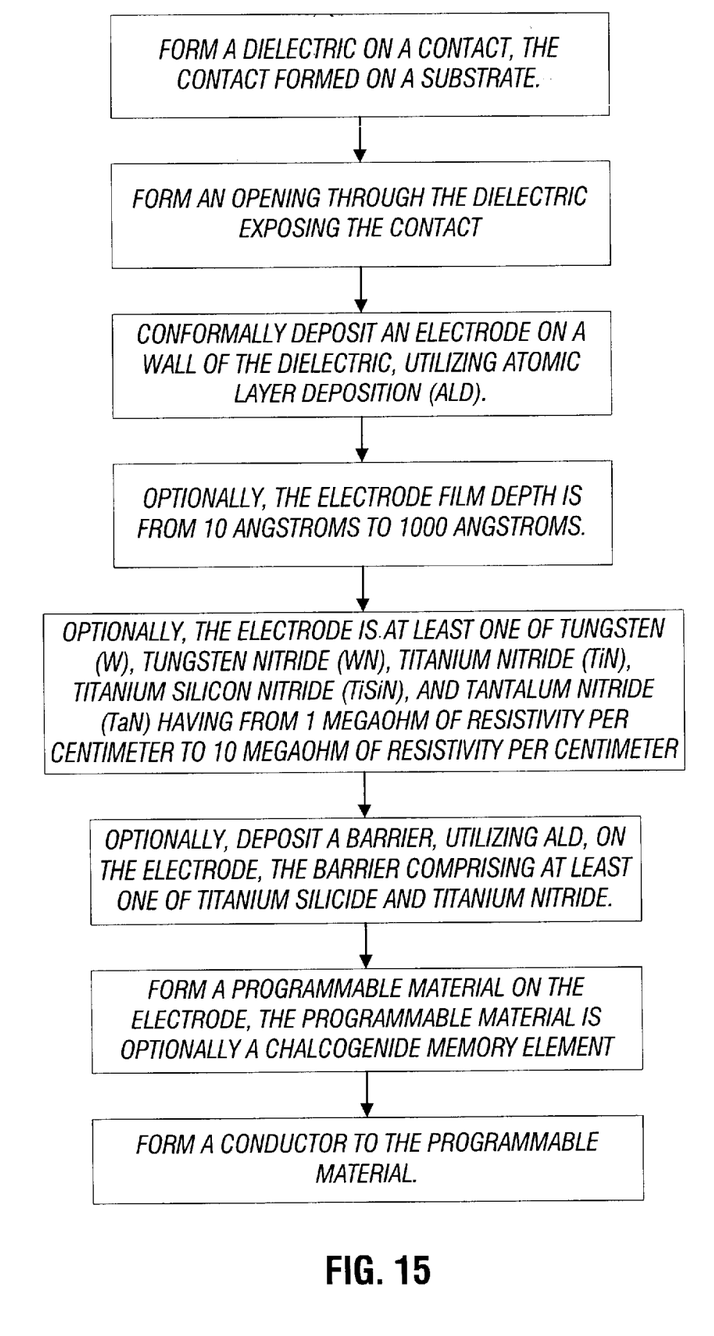
FIG. 15 depicts a method of forming a memory device having a structure similar to that described by FIG. 14.

FIG. 15 describes a method in forming a programmable memory device, having a structure similar to that depicted in FIG. 14, in accordance with an embodiment.

Figure 16:
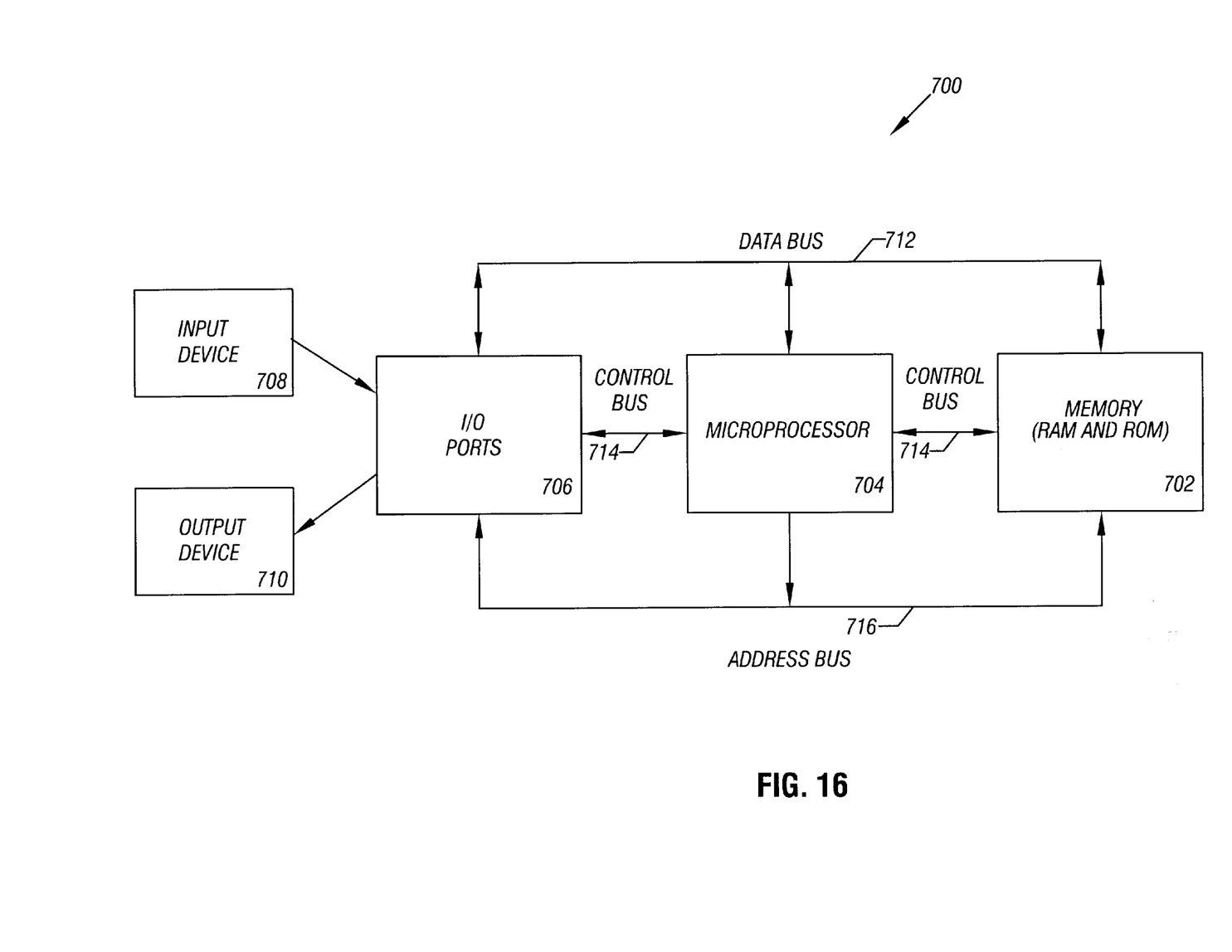
FIG. 16 depicts one system embodiment including a memory having a structure similar to that described by FIG. 14.

Further, as depicted in FIG. 16, a memory array such as memory device 5 (FIG. 1) wherein the individual memory cells have a structure similar to that described with reference to FIG. 14 and the accompanying text can be incorporated into a suitable system. In one embodiment, system 700 includes microprocessor 704, input/output (I/O) port 706, and memory 702. Microprocessor 704, I/O port 706, and memory 702 are connected by data bus 712, address bus 716 and control bus 714. Microprocessor 704 fetches instructions or reads data from memory 702 by sending out an address on address bus 716 and a memory read signal on control bus 714. Memory 702 outputs the addressed instruction or data word to microprocessor 704 on data bus 712. Microprocessor 704 writes a data word to memory 702 by sending out an address on address bus 716, sending out the data word on data bus 712, and sending a memory write signal to memory 702 on control bus 714. I/O port 706 is utilized to couple to at least one of input device 708 and output device 710.

Having disclosed exemplary embodiments, modifications and variations may be made to the disclosed embodiments while remaining within the spirit and scope of the invention as defined by the appended claims.

What is claimed is:

1. A method comprising:
   forming a dielectric on a contact, the contact formed on a substrate;
   forming an opening through the dielectric exposing the contact;
   conformally depositing an electrode on a wall of the dielectric, utilizing atomic layer deposition (ALD);
   forming a programmable material on the electrode; and
   forming a conductor to the programmable material.

2. The method of claim 1, further comprising:
   depositing a barrier, utilizing ALD, between the electrode and the programmable material, the barrier comprising at least one of titanium silicide and titanium nitride.

3. The method of claim 1, wherein conformally depositing the electrode comprises conformally depositing from 10 angstroms to 1000 angstroms of electrode film thickness.

4. The method of claim 1, wherein conformally depositing the electrode comprises conformally depositing at least one of tungsten (W), tungsten nitride (WN), titanium nitride (TiN), titanium silicon nitride (TiSiN), and tantalum nitride (TaN) having from 0.001 ohm-cm to 0.05 ohm-cm resistivity.

5. The method of claim 1, wherein forming a programmable material comprises forming a chalcogenide memory element.

* * * * *

UNITED STATES PATENT AND TRADEMARK OFFICE
CERTIFICATE OF CORRECTION

PATENT NO.     : 6,511,867 B2
DATED          : January 28, 2003
INVENTOR(S)    : Tyler A. Lowrey and Charles H. Dennison It is certified that error appears in the above-identified patent and that said Letters Patent is hereby corrected as shown below:

<u>Title page,</u>
Item [73], Assignees, the city and state should read -- Boise, Idaho --.

Signed and Sealed this

Ninth Day of September, 2003

JAMES E. ROGAN
*Director of the United States Patent and Trademark Office*